US009255326B2

(12) United States Patent
Na et al.

(10) Patent No.: US 9,255,326 B2
(45) Date of Patent: *Feb. 9, 2016

(54) SYSTEMS AND METHODS FOR REMOTE PLASMA ATOMIC LAYER DEPOSITION (71) Applicant: Novellus Systems, Inc., San Jose, CA (US)

(72) Inventors: Jeong-Seok Na, San Jose, CA (US); Sanjay Gopinath, Fremont, CA (US)

(73) Assignee: Novellus Systems, Inc., San Jose, CA (US)

( * ) Notice: Subject to any disclaimer, the term of this patent is extended or adjusted under 35 U.S.C. 154(b) by 213 days.

This patent is subject to a terminal disclaimer.

(21) Appl. No.: 13/795,819

(22) Filed: Mar. 12, 2013

(65) Prior Publication Data

US 2014/0272185 A1    Sep. 18, 2014

(51) Int. Cl.
| H05H 1/24 | (2006.01) |
| C23C 16/34 | (2006.01) |
| C23C 16/455 | (2006.01) |
| C23C 16/507 | (2006.01) |

(52) U.S. Cl.
CPC .......... *C23C 16/34* (2013.01); *C23C 16/45536* (2013.01); *C23C 16/45544* (2013.01); *C23C 16/507* (2013.01)

(58) Field of Classification Search
CPC  C23C 16/34; C23C 13/507; C23C 16/45544; C23C 16/45536
USPC ........................................................ 427/569
See application file for complete search history.

(56) References Cited

U.S. PATENT DOCUMENTS

| 5,614,026 | A | 3/1997 | Williams |
| 6,883,733 | B1 | 4/2005 | Lind |
| 7,049,226 | B2 | 5/2006 | Chung et al. |
| 8,083,853 | B2 | 12/2011 | Choi et al. |
| 8,328,939 | B2 | 12/2012 | Choi et al. |
| 8,419,959 | B2 | 4/2013 | Bettencourt et al. |
| 8,869,742 | B2 | 10/2014 | Dhindsa et al. |
| 2006/0228496 | A1 | 10/2006 | Choi et al. |
| 2010/0003406 | A1 | 1/2010 | Lam et al. |
| 2011/0114601 | A1 | 5/2011 | Lubomirsky et al. |
| 2011/0227037 | A1* | 9/2011 | Su .................................. 257/13 |
| 2012/0077349 | A1* | 3/2012 | Li et al. ......................... 438/762 |
| 2012/0115325 | A1 | 5/2012 | Park et al. |
| 2012/0161405 | A1* | 6/2012 | Mohn et al. .................... 279/142 |
| 2013/0260488 | A1* | 10/2013 | Kim et al. ...................... 438/26 |
| 2013/0306758 | A1* | 11/2013 | Park et al. ..................... 239/418 |
| 2013/0341433 | A1* | 12/2013 | Roy et al. ...................... 239/548 |
| 2014/0179114 | A1 | 6/2014 | van Schravendijk |
| 2014/0235069 | A1 | 8/2014 | Breiling et al. |
| 2015/0007770 | A1 | 1/2015 | Chandrasekharan et al. |

OTHER PUBLICATIONS

U.S. Appl. No. 13/531,254, filed Jun. 22, 2012, Shambhu N. Roy et al.

* cited by examiner

*Primary Examiner* — Kelly M Gambetta

(57) ABSTRACT

Systems and methods deposit a film on a substrate by introducing a precursor gas into a reaction volume of a processing chamber. A substrate is arranged in the reaction volume. After a predetermined soak period, the precursor gas is purged from the reaction volume. The substrate is exposed with plasma gas using a remote plasma source.

12 Claims, 9 Drawing Sheets

SYSTEMS AND METHODS FOR REMOTE PLASMA ATOMIC LAYER DEPOSITION

FIELD

The present disclosure relates to substrate processing systems, and more particularly to systems and methods for remote plasma atomic layer deposition.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Figure 1:
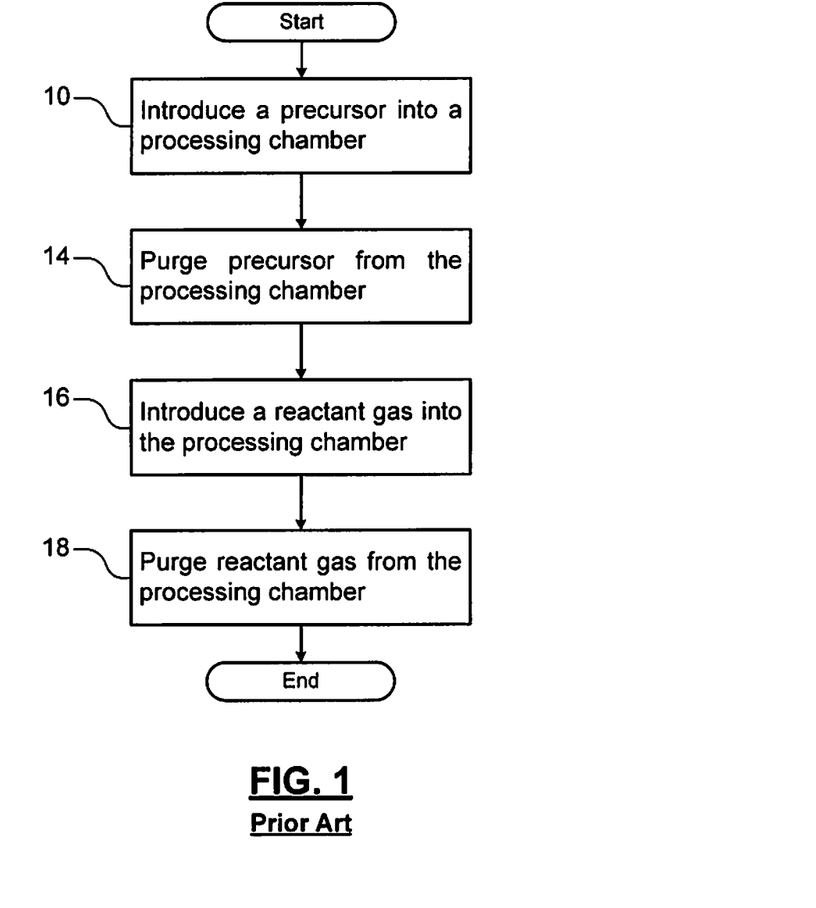
FIG. 1 is a flowchart illustrating a method for performing thermal atomic layer deposition (tALD) according to the prior art.

FIG. 1 illustrates an example of a method for depositing a film on a substrate such as a semiconductor wafer using thermal atomic layer deposition (tALD). At 10, a precursor is introduced into a reaction volume of a processing chamber to expose a substrate such as a semiconductor wafer. At 14, the precursor is purged from the reaction volume. At 16, a reactant gas is introduced into the reaction volume. For example, the reactant gas may be ammonia. At 18, the reactant gas is purged.

A resulting film on the substrate has negligible damage to an extreme low k (ELK) dielectric layer and conformal step coverage. However, the film has poor film density, typically around 8.8 g/cm$^3$. This causes poor barrier performance in Cu thermal diffusion and moisture out-diffusion from the ELK dielectric layer.

In contrast, ion-induced atomic layer deposition (iALD) or plasma-enhanced atomic layer deposition (PEALD) processes use a capacitively-coupled plasma (CCP) treatment with a combination of argon, hydrogen, and ammonia at 16 in FIG. 1. The resulting film has high film density (13 g/cm$^3$) and good step coverage. However, the film has significant ELK damage, yield loss, and high content of undesirable carbon impurity (for example, >20 atomic %).

SUMMARY

A method for depositing a film on a substrate includes introducing a precursor gas into a reaction volume of a processing chamber, wherein a substrate is arranged in the reaction volume; after a predetermined soak period, purging the precursor gas from the reaction volume; and exposing the substrate with plasma gas using a remote plasma source.

In other features, the method further includes arranging a plasma dome above a dual plenum showerhead; locating the substrate on a pedestal in the reaction volume adjacent to the dual plenum showerhead; supplying the precursor gas to a first plenum defined between first and second plates of the dual plenum showerhead, wherein the precursor gas flows through first distribution holes in the dual plenum showerhead to the reaction volume; and supplying the plasma gas to a second plenum of the plasma dome The second plenum is defined between the plasma dome and the dual plenum showerhead. The plasma gas flows through second distribution holes in the dual plenum showerhead to the reaction volume.

In other features, the plasma gas is generated remotely in the second plenum by supplying a process gas to the second plenum; arranging coils around the plasma dome; and supplying current to the coils to generate the plasma gas in the second plenum.

In other features, the method further includes purging the plasma gas from the reaction volume. The precursor gas includes one of tantalum, nitrogen and carbon. The plasma gas includes one of argon and hydrogen (Ar/H$_2$), nitrogen and hydrogen (N$_2$/H$_2$), nitrogen and ammonia (N$_2$/NH$_3$), helium and hydrogen (He/H$_2$) and/or hydrogen (H$_2$). The plasma gas includes one of nitrogen and hydrogen (N$_2$/H$_2$) and nitrogen and ammonia (N$_2$/NH$_3$).

In other features, the precursor gas and the plasma gas flow through the dual plenum showerhead using separate paths. The method further includes performing a post plasma treatment using the plasma gas. The method further includes purging the post plasma treatment.

In other features, the method further includes, prior to the exposing the substrate with the plasma gas using the remote plasma source, introducing a reactant gas dose into the reaction volume and purging the reactant gas dose.

In other features, the method further includes performing a post plasma treatment using the plasma gas. The method further includes purging the post plasma treatment.

A substrate processing system for depositing a film on a substrate includes a processing chamber including a reaction volume. A substrate is arranged on a pedestal in the reaction volume. A dual plenum showerhead is arranged between the plasma dome and the reaction volume. A first plenum defined by the dual plenum showerhead and a second plenum is defined between the plasma dome and the dual plenum showerhead. Plasma gas is generated remotely in the second plenum. A precursor source supplies a precursor gas to the first plenum. The precursor gas flows through first distribution holes in the dual plenum showerhead to the reaction volume. The plasma gas flows through second distribution holes in the dual plenum showerhead to the reaction volume. A controller is configured to introduce the precursor gas into the reaction volume. After a predetermined period, the controller is configured to purge the precursor gas from the reaction volume. The controller is configured to expose the substrate to the plasma gas.

In other features, the controller is configured to purge the plasma gas from the reaction volume. The precursor gas includes one of tantalum, nitrogen and carbon. The plasma gas includes one of argon and hydrogen (Ar/H$_2$), nitrogen and hydrogen (N$_2$/H$_2$), nitrogen and ammonia (N$_2$/NH$_3$), helium and hydrogen (He/H$_2$) and/or hydrogen (H$_2$). The plasma gas includes one of nitrogen and hydrogen (N$_2$/H$_2$) and nitrogen and ammonia (N$_2$/NH$_3$). The controller is configured to perform a post plasma treatment using the plasma gas. The controller is configured to purge the post plasma treatment.

In other features, the controller is configured to, prior to the exposing the substrate with the plasma gas, introduce a reactant dose into the reaction volume and purge the reactant dose. The controller is configured to perform a post plasma treatment using the plasma gas. The controller is configured to purge the post plasma treatment.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure describes systems and methods for using remote plasma atomic layer deposition (RPALD) to deposit film such as tantalum nitride (TaN) film or another film where a remote plasma source is used in a plasma dose step or a post-plasma treatment step. In some examples, a dual plenum showerhead blocks the intermixing of precursor gas and reactant gas. Using the remote plasma source, the systems and methods described herein improve film density and produce film with fewer impurities (carbon, oxygen). The systems and methods also provide conformal step coverage and minimize extreme low dielectric (ELK) damage.

The systems and methods described herein utilize a remote plasma source as a reactant and/or as a post-plasma treatment. The remote plasma source generates a high density of hydrogen-containing radicals involved in the reaction with the precursor gas. Most of the ions associated with ELK damage may be filtered during delivery to the substrate. In some examples, the precursor gas includes tantalum (Ta), nitrogen (N), and carbon (C). The precursor gas is introduced to a first plenum of a dual plenum showerhead. In some examples, process gases including argon and hydrogen (Ar/$H_2$), nitrogen and hydrogen ($N_2$/$H_2$), nitrogen and ammonia ($N_2$/$NH_3$), helium and hydrogen (He/$H_2$) and/or hydrogen ($H_2$) are supplied to a plasma dome to generate the remote plasma source.

In some examples, the dual plenum showerhead delivers the remotely-generated plasma to the wafer. In some examples, gas compositions with $N_2$/$H_2$ and $N_2$/$NH_3$ are used to achieve desired film properties, although other gas compositions such as, but not limited to, those described herein can be used. Due to the high density and non-directionality of hydrogen radicals that are generated, the systems and methods described herein can be applied to various small features that require thin, continuous step coverage and minimal plasma damage.

Figure 2A:
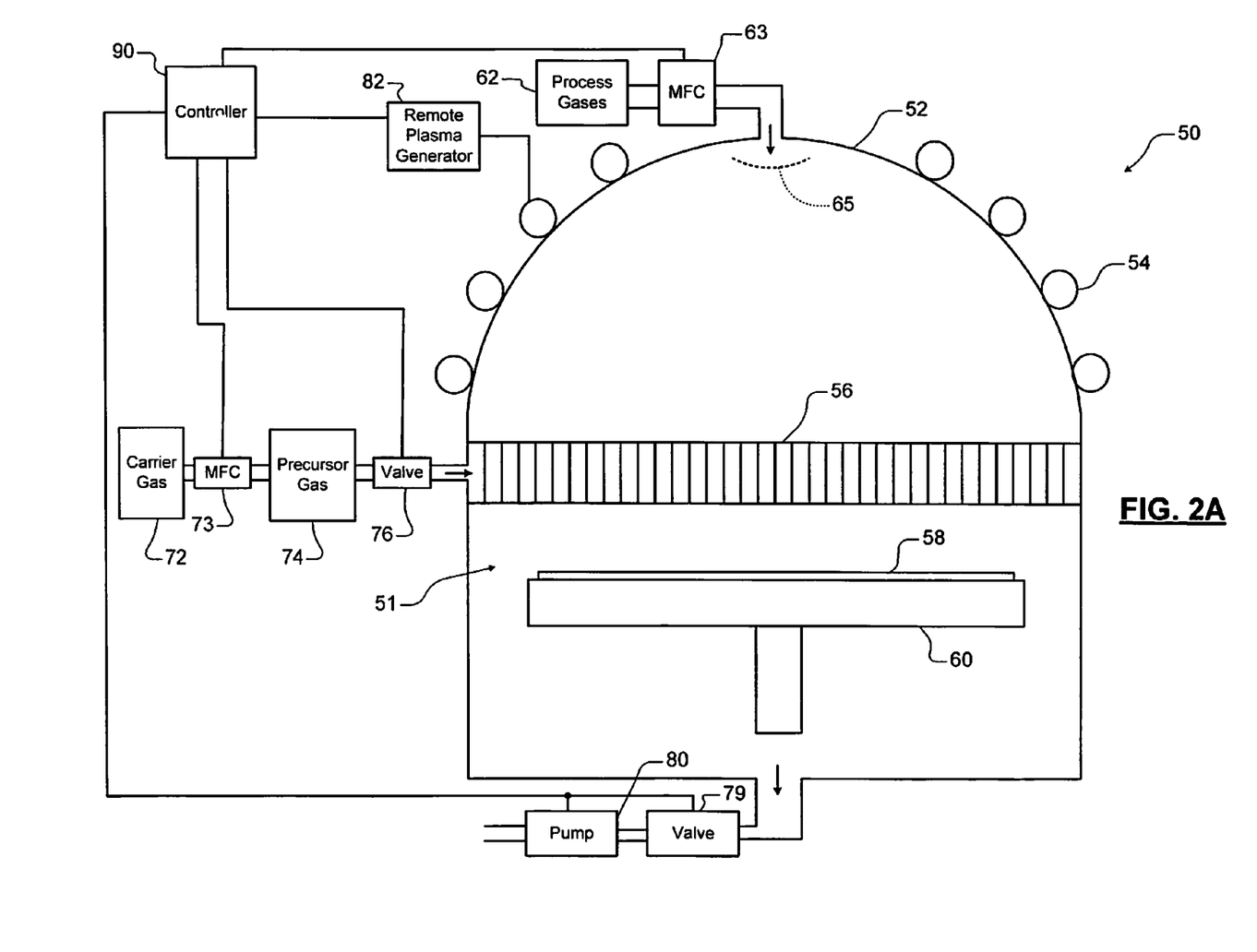
FIGS. 2A and 2B are functional block diagrams of a reaction volume for remote plasma atomic layer deposition (RPALD) according to the present disclosure.
Figure 2B:
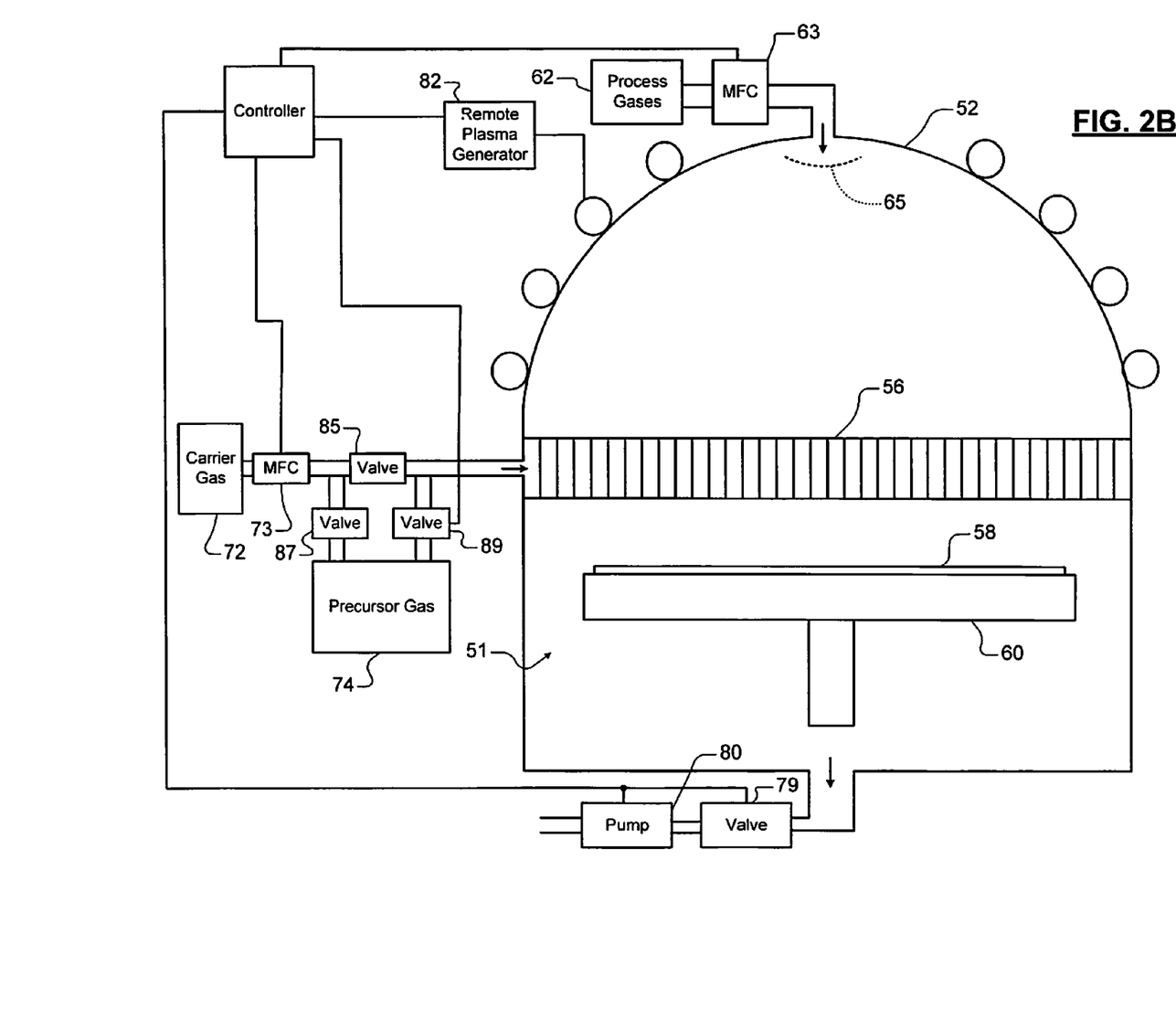

Referring now to FIGS. 2A and 2B, examples of suitable substrate processing systems 50 include a reaction volume 51 and a plasma dome 52 arranged adjacent to and in fluid communication with the reaction volume 51. In some examples, the plasma dome 52 may be made of quartz or another suitable material. A plurality of electromagnetic coils 54 may be arranged around an outside surface of the plasma dome 52. A dual plenum showerhead 56 may be arranged between the plasma dome 52 and the reaction volume 51. A substrate 58 may be arranged on a pedestal 60 in the reaction volume 51 below the dual plenum showerhead 56.

Process gases 62 are supplied via a mass flow controller 63 to a second plenum defined between the plasma dome 52 and the dual plenum showerhead 56. A diffuser 65 may be used to diffuse the process gas. A remote plasma generator 82 is connected to electromagnetic coils 54. The remote plasma generator 82 may include a current source to supply current to the coils 54. Process gas is supplied to the second plenum and the plasma gas is remotely generated by an induced magnetic field and an electric field when the remote plasma generator 82 flows current along the coils 54 around the plasma dome 52. Alternately, the plasma gas may be generated outside of the plasma dome 52 and delivered to the plasma dome 52.

In FIG. 2A, carrier gas 72 and a precursor gas 74 are supplied via a mass flow controller 73 and a valve 76 to the dual plenum showerhead 56. In FIG. 2B, an alternate arrangement is shown where carrier gas 72 and a precursor gas 74 are supplied via a mass flow controller 73 and multiple valves 85, 87 and 89 to the dual plenum showerhead 56.

The first plenum is defined between upper and lower plates of the dual plenum showerhead 56 as will be described further below. A valve 79 and a pump 80 may be used to purge gas from the reaction volume 51.

The dual plenum showerhead 56 separately delivers precursor or plasma to the reaction volume. In other words, the precursor gas travels from the precursor source to the first plenum of the dual plenum showerhead 56 and through first distribution holes in the dual plenum showerhead 56 to the reaction volume 51. In contrast, the plasma flows from the second plenum through a second set of distribution holes in the dual plenum showerhead 56 to the reaction volume 51. A controller 90 may be used to control the process and may be connected to the valves 76 and 79, the mass flow controller 73, the pump 80, and the remote plasma generator 82.

Figure 3:
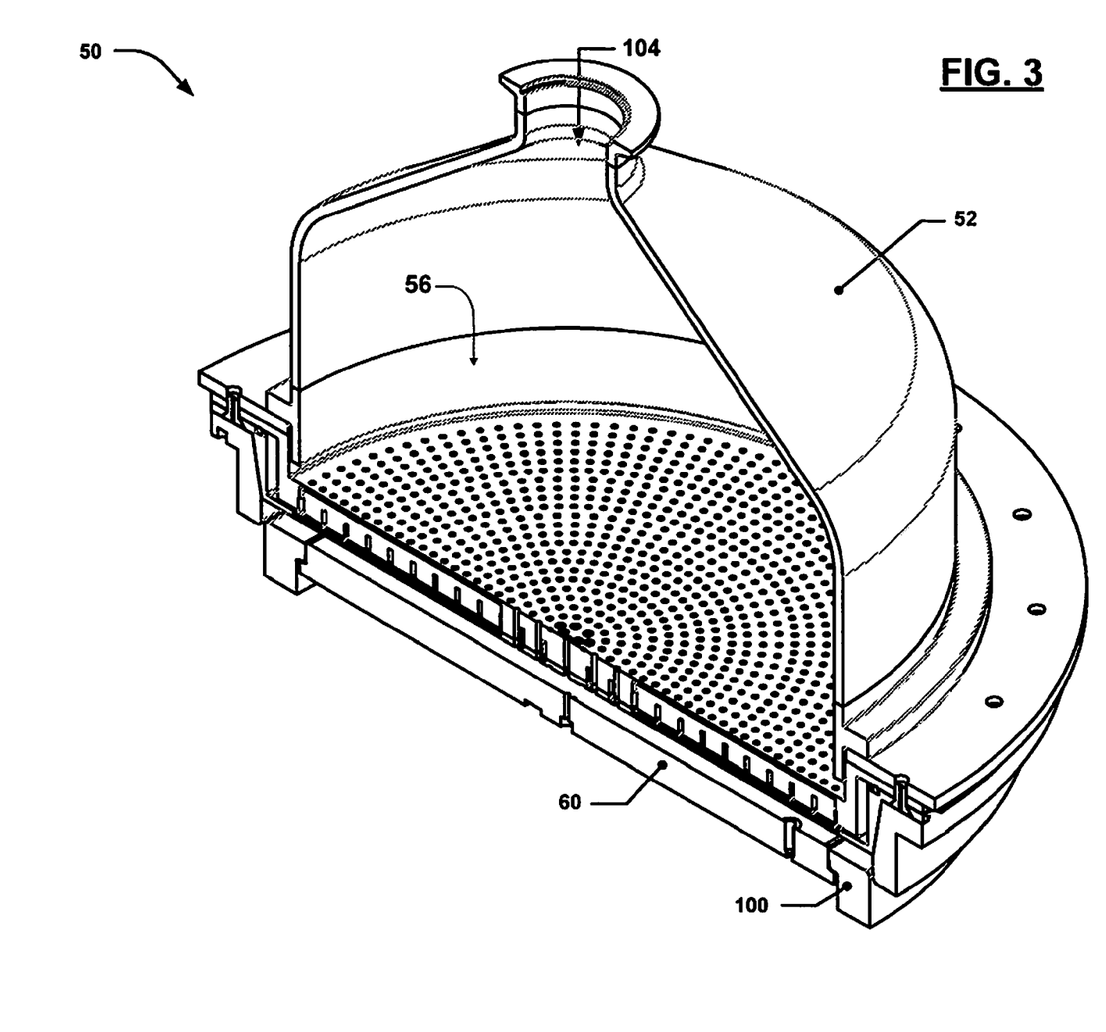
FIG. 3 depicts an isometric section view of an example of a dual-plenum showerhead according to the present disclosure.
Figure 4:
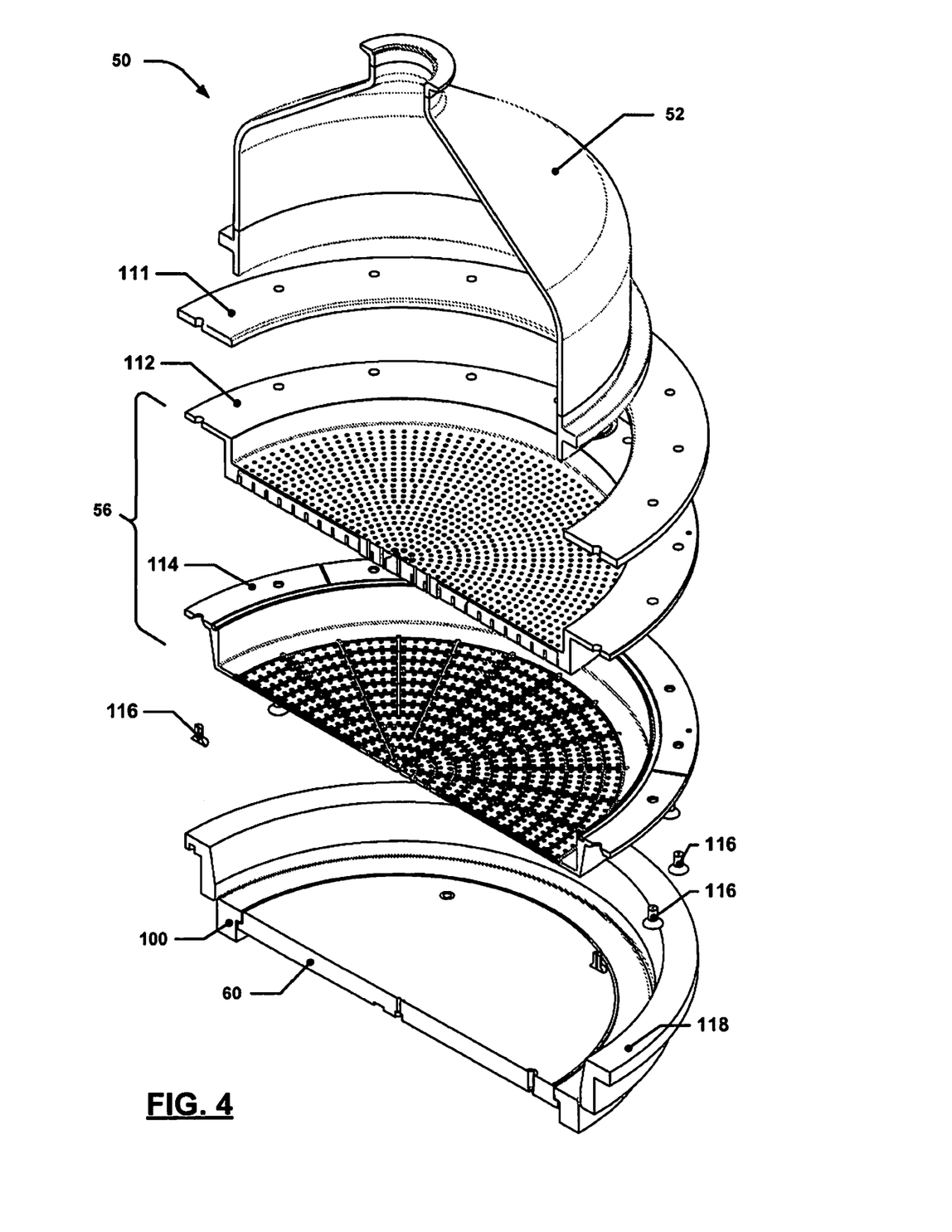
FIG. 4 depicts an exploded, isometric section view of the example dual-plenum showerhead according to the present disclosure.
Figure 5:
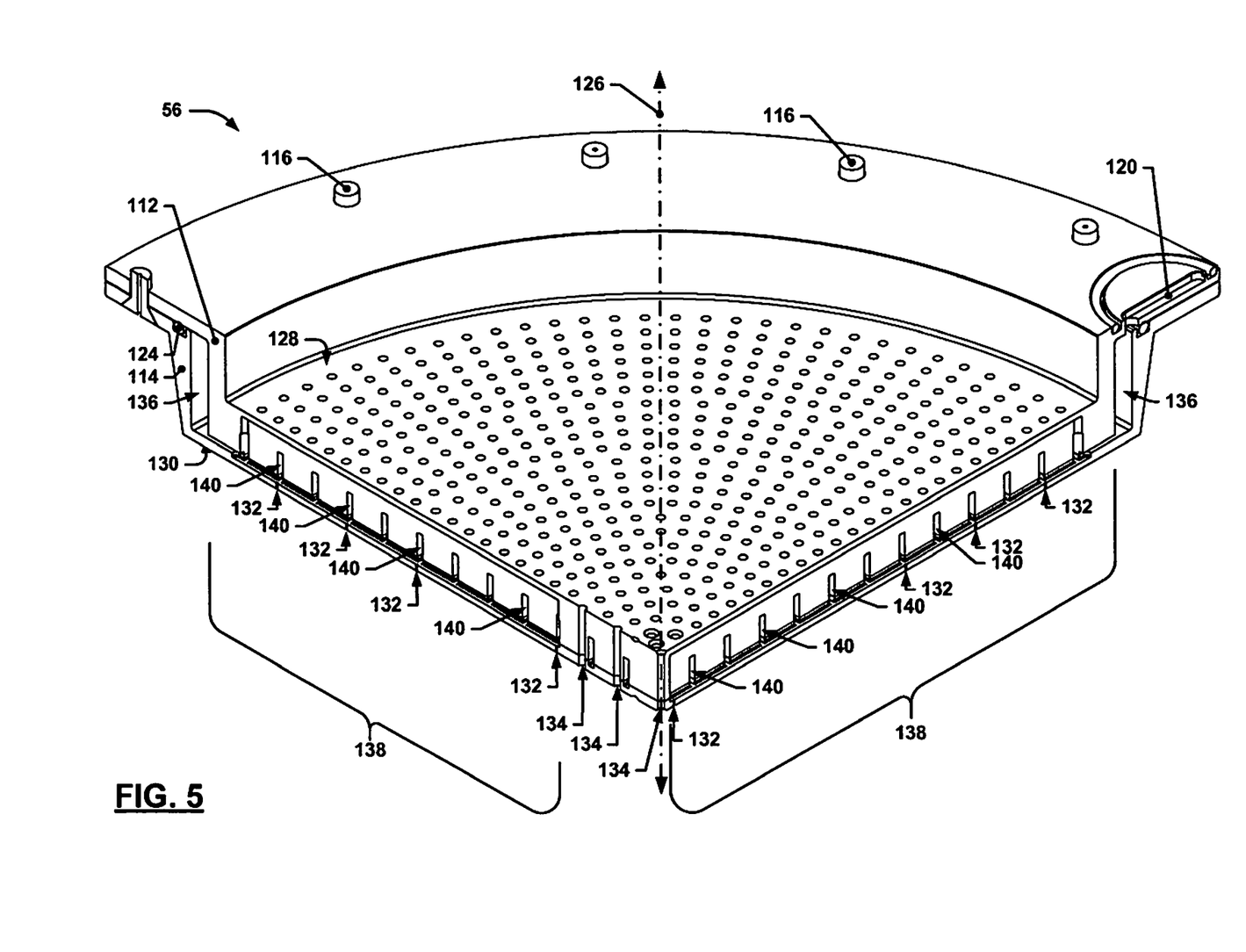
FIG. 5 depicts an isometric, quarter-section view of the dual-plenum showerhead of FIG. 4 according to the present disclosure.

In some examples, the plasma dome 52 and the dual plenum showerhead 56 may be implemented in a manner similar to that described in commonly-assigned "Dual Plenum, Axi-Symmetric Showerhead with Edge-To-Center Gas Delivery", U.S. patent application Ser. No. 13/531,254, filed on Jun. 22, 2012, which is hereby incorporated by reference in its entirety. FIGS. 3-5 show further details of an example of the dual plenum showerhead 56.

FIG. 3 shows the plasma dome 52 arranged above the dual plenum showerhead 56. An area between the plasma dome 52 and the dual plenum showerhead 56 defines the second plenum. The plasma dome 52 may include a mounting location 104 to introduce the process gases 62 (or plasma if the plasma is generated remotely from the plasma dome 52) that is located on a top portion of the plasma dome 52.

FIG. 3 also shows the pedestal 60 and a guard ring 100, which are not components of the dual plenum showerhead 56, but are depicted to provide additional context to illustrate how the dual plenum showerhead 56 may be positioned relative to the substrate 58 (or the pedestal 60) in the substrate processing system 50.

FIG. 4 shows an upper faceplate 112 and a lower faceplate 114 of the dual plenum showerhead 56. Fasteners 116 such as screws may be used to attach the upper faceplate 112 to the lower faceplate 114. The fasteners 116 may thread into an interface plate 111, which mates with a flange on the upper faceplate 112. The dual plenum showerhead 56 may be seated in a mounting ring 118. The mounting ring 118 may have a slightly larger diameter than the diameter of the guard ring 108 to allow the mounting ring 118 to slide down and around the guard ring 108.

The dual plenum showerhead 56 may be made from any suitable material such as aluminum, ceramic, or other materials compatible with a semiconductor processing environment. While the upper faceplate 112 and the lower faceplate 114 are shown fastened together, they can be fabricated in other ways. For example, the upper faceplate 112 and the lower faceplate 114 may be bonded together, for example, with a diffusion bond or brazing.

FIG. 5 shows a lower surface of the upper faceplate 112 resting on an upper surface of the lower faceplate 114. A gap between the upper faceplate 112 and the lower faceplate 114 forms a gas distribution channel 136. For example only, the gas distribution channel 136 may be annular. Gas feed inlets 120 may be in fluid communication with the gas distribution channel 136. A faceplate O-ring 124 may prevent gas from the gas feed inlets 120 and the gas distribution channel 136 from escaping through an interface between the upper faceplate 112 and the lower faceplate 114.

FIG. 5 also shows first channels 138 that are formed by the faceplates 112 and 114 and that may extend in a substantially radial direction with respect to the center axis 126. Other examples may feature other channel shapes, such as non-radial spoke channels, curving channels, pinwheel channels or other configurations. In some examples, the first channels 138 may generally extend towards the center axis 126 of the faceplates 112 and 114 from locations spaced about the periphery of the faceplates 112 and 114.

Second channels 140 may be formed within the faceplate 112 and may extend in a substantially circumferential direction with respect to the center axis 126. The second channels 140 may have different nominal diameters and may be spaced apart such that they are distributed across the faceplate 112. While the second channels 140 that are shown are concentric annular channels that extend through 360 degrees, other examples may feature other channel path shapes. For example, instead of multiple annular second channels 140, one or multiple spiral second channels centered on the center axis 126 may be used in some examples.

The faceplates 112 and 114 may feature two different sets of gas distribution holes, each serving to exhaust a different plenum volume. For example, the faceplates 112 and 114 may include first gas distribution holes 132 and second gas distribution holes 134. The second gas distribution holes 134 may allow gas within the second plenum volume to escape towards the reaction volume 51.

The first plenum may be formed, at least in part, by volume defined by the first channels and the second channels. The first gas distribution holes 132 may allow gas within the first plenum to escape towards the reaction volume 51. The first gas distribution holes 132 may be smaller than the second gas distribution holes 134. The second gas distribution holes 134 may also extend completely through the faceplates 112 and 114, i.e., from top surface 128 to bottom surface 130. In some examples, since the remote plasma may be generated in the second plenum, it may be desirable to increase the number of free radicals that are released into the reaction volume 51. The second gas distribution holes 134 may thus have a diameter that, within certain constraints, is configured to maximize, to the extent possible, the number of free radicals that pass into the reaction volume 51.

Figure 6:
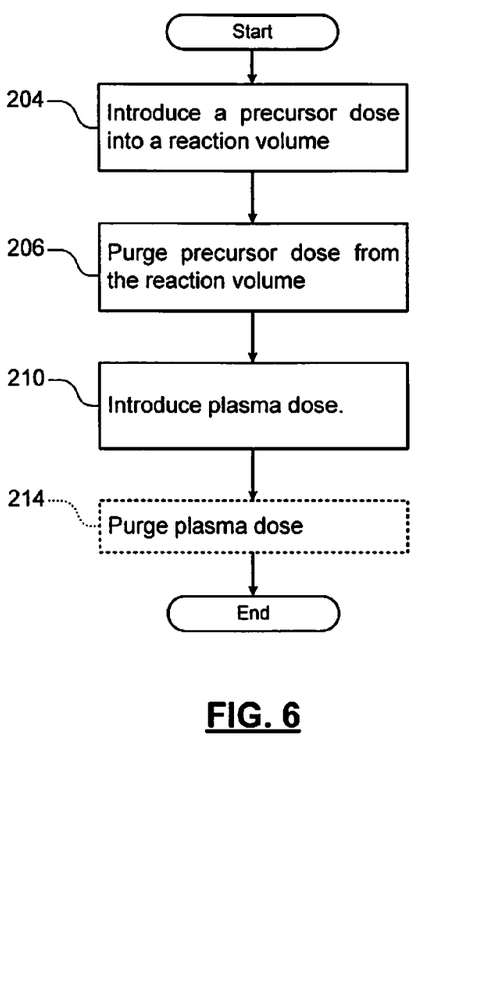
FIG. 6 is a flowchart illustrating an example of a method for performing RPALD according to the present disclosure.

FIG. 6 illustrates an example of a method according to the present disclosure. At 204, a precursor dose is introduced into a reaction volume. At 206, the precursor dose is purged from the reaction volume. At 210, a plasma dose is introduced into the reaction volume using a remote plasma source. At 214, the plasma dose is optionally purged.

Figure 7:
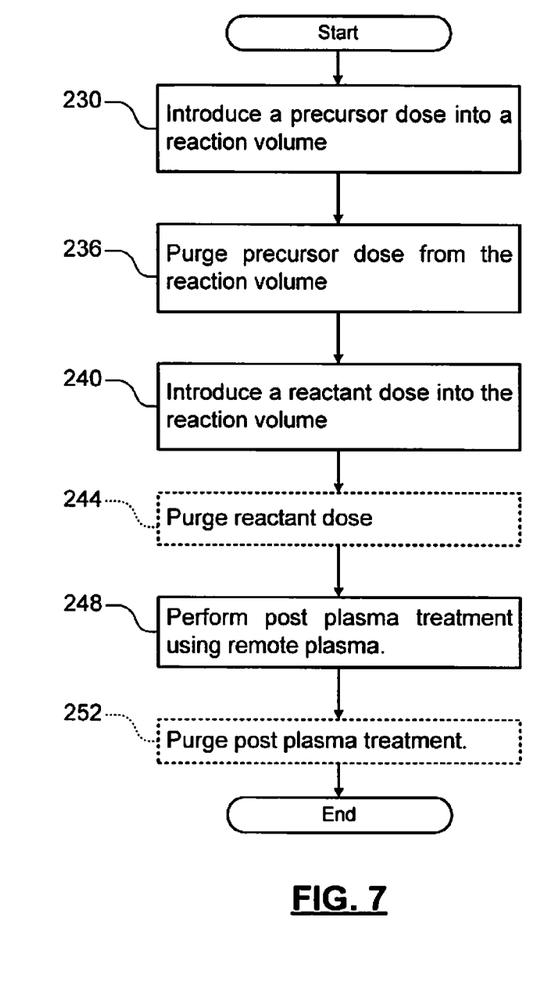
FIG. 7 is a flowchart illustrating an example of another method for performing RPALD according to the present disclosure.

FIG. 7 illustrates another example of a method according to the present disclosure. At 230, a precursor dose is introduced into a reaction volume. At 236, the precursor dose is purged from the reaction volume. At 240, a reactant dose is introduced into the reaction volume. At 244, the reactant dose is purged from the reaction volume. At 248, a post-plasma treatment step is performed using remote plasma. At 252, the post plasma treatment is optionally purged from the reaction volume.

For example only, a method based on FIG. 7 may include a thermal reaction followed by post-plasma treatment including a precursor dose, purge, an $NH_3$ reactant dose, purge, a remote plasma $N_2/NH_3$ or $N_2/H_2$ treatment, and then purge.

Figure 8:
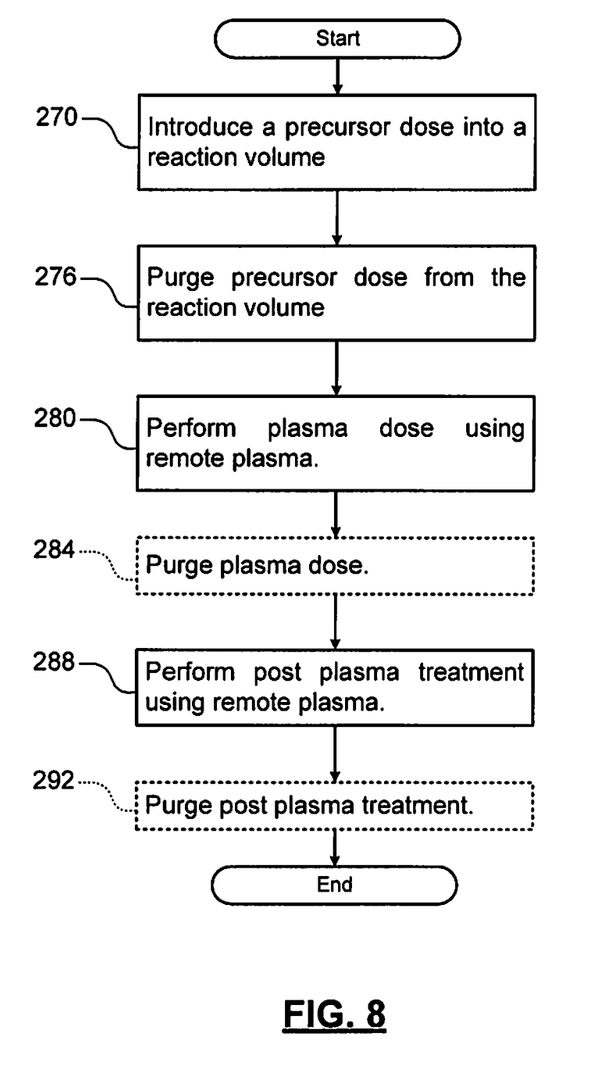
FIG. 8 is a flowchart illustrating an example of another method for performing RPALD according to the present disclosure.

FIG. 8 illustrates another example of a method according to the present disclosure. At 270, a precursor dose is introduced into a reaction volume. At 276, the precursor dose is purged from the reaction volume. At 280, a plasma dose step is performed using remote plasma. At 284, the plasma dose is optionally purged from the reaction volume. At 288, a post-plasma treatment step is performed using remote plasma. At 292, the post plasma treatment is optionally purged from the reaction volume.

For example only, a method based on FIG. 7 may include two different types of remote plasma gas treatment. The example includes a precursor dose, purge, a remote plasma $N_2/H_2$ dose (or $He/H_2$), purge, a remote plasma $He/H_2$ (or $N_2/H_2$) and then purge.

Figure 9:
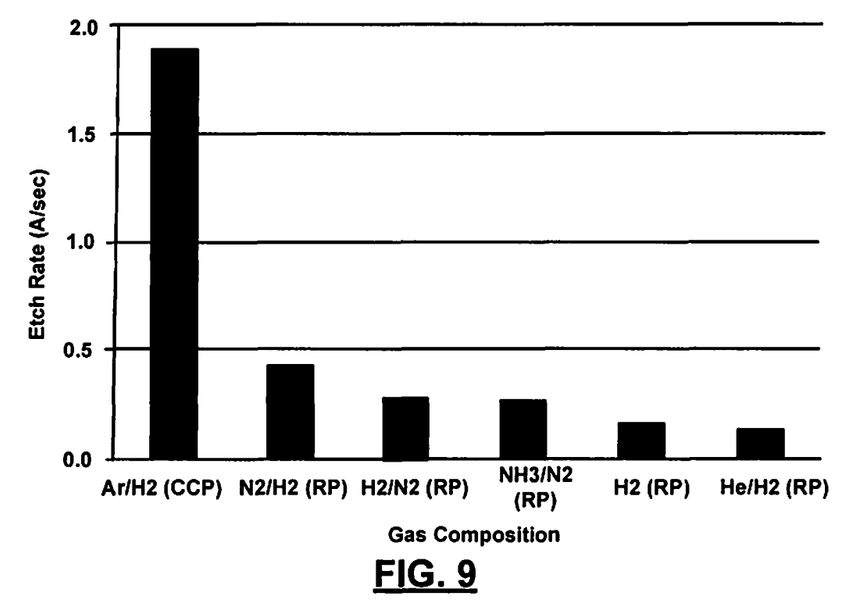
FIG. 9 is a graph illustrating etch rate as a function of plasma gas composition.
Figure 10:
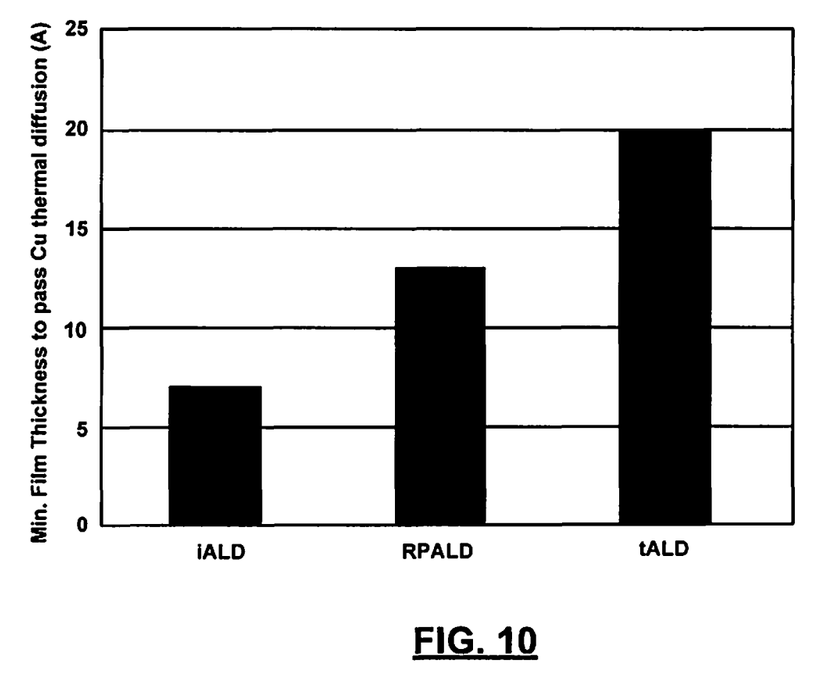
FIG. 10 is a graph illustrating minimum film thickness to pass Cu thermal diffusion as a function of various processes.

Referring now to FIGS. 9-10, the ELK thickness loss, growth rate, film chemical composition, film density, and Cu thermal diffusion barrier test of RPALD TaN process were assessed and compared with iALD and tALD processes. Referring now to FIG. 9, an etch test on ELK blanket substrates (k=2.4) showed that the remote plasma source with $H_2/N_2$ or $NH_3/N_2$ had lower ELK thickness loss by a factor of approximately 5 as compared to the capacitively coupled plasma with $Ar/H_2$.

Referring now to Table 1 below, the RPALD processes described herein are expected to yield high growth rate of 1 A/cycle, almost stoichiometric TaN composition with reduced carbon impurity of 3 at. %, and improved film density of 11.2 g/cm$^3$. The high growth rate might be attributed to the enhanced chemisorptions of precursor molecules on hydrogen radicals terminated surface.

TABLE 1

| Process | Growth Rate (A/Cycle) | Film Density (g/cm$^3$) | Chemical Composition (at. %) | | | |
| --- | --- | --- | --- | --- | --- | --- |
| | | | Ta | N | C | O |
| iALD | 0.4 | 13 | 49 | 26 | 23 | 2 |
| RPALD | 1.0 | 11.2 | 48 | 47 | 3 | 2 |
| tALD | 0.65 | 8.8 | 48 | 41 | 9 | 2 |

Referring now to FIG. 10, plasma gas is shown where Cu 100A film was deposited as a capping layer. The Cu thermal diffusion barrier performance of TaN film was evaluated at 400° C., 30 minutes in an oven under forming gas ambient.

RPALD TaN process showed that minimum film thickness for passing the Cu thermal diffusion barrier test was approximately 13 Å, which is in the middle of tALD and iALD TaN.

RP ALD TaN provides the thin and conformal step coverage on small features due to non-directional distribution of radicals. RPALD TaN process with $H_2/N_2$ or $NH_3/N_2$ achieved the improved film properties such as chemical composition and film density with minimized ELK underlayer damage.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term module may be replaced with the term circuit. The term module may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A method for depositing a film on a substrate, comprising:
   introducing a precursor gas into a reaction volume of a processing chamber, wherein a substrate is arranged in the reaction volume, and wherein the precursor gas is introduced to the reaction volume through first gas distribution holes of a first plenum of a dual plenum showerhead arranged above the substrate,
   wherein the first gas distribution holes and the first plenum are defined by an upper faceplate and a lower faceplate,
   wherein a gas distribution channel around a perimeter of the first plenum is formed in a gap between the upper faceplate and the lower faceplate, wherein the gap is defined by a first sidewall of the upper faceplate and a second sidewall of the lower faceplate such that the gap is formed between the first sidewall and the second sidewall,
   wherein the precursor gas is introduced into the gas distribution channel via gas feed inlets at the perimeter of the first plenum and flows from the gas distribution channel through the first gas distribution holes and into the reaction volume;
   after a predetermined soak period, purging the precursor gas from the reaction volume; and
   exposing the substrate with plasma gas using a remote plasma source, wherein the plasma gas is provided to the reaction volume through a second plenum of the dual plenum showerhead and through second gas distribution holes that pass through the first plenum,
   wherein the precursor gas is not provided through either of the second gas distribution holes or the second plenum, and wherein the plasma gas is not provided through the first gas distribution holes of the first plenum.

2. The method of claim 1, further comprising:
   arranging a plasma dome above the dual plenum showerhead; and
   locating the substrate on a pedestal in the reaction volume adjacent to the dual plenum showerhead,
   wherein the second plenum is defined between the plasma dome and the dual plenum showerhead.

3. The method of claim 2, wherein the plasma gas is generated remotely in the second plenum by:
   supplying a process gas to the second plenum;
   arranging coils around the plasma dome; and
   supplying current to the coils to create the plasma gas in the second plenum.

4. The method of claim 1, further comprising purging the plasma gas from the reaction volume.

5. The method of claim 1, wherein the precursor gas is selected from a group consisting of a tantalum-based gas, a nitrogen-based gas, and a carbon-based gas.

6. The method of claim 1, wherein the plasma gas is selected from a group consisting of argon and hydrogen (Ar/$H_2$), nitrogen and hydrogen ($N_2/H_2$), nitrogen and ammonia ($N_2/NH_3$), helium and hydrogen (He/$H_2$), and hydrogen ($H_2$).

7. The method of claim 1 wherein the plasma gas is selected from a group consisting of nitrogen and hydrogen ($N_2/H_2$) and nitrogen and ammonia ($N_2/NH_3$).

8. The method of claim 1, further comprising:
   performing a post plasma treatment using the plasma gas.

9. The method of claim 8, further comprising:
   purging the post plasma treatment.

10. The method of claim 1, further comprising:
    prior to the exposing the substrate with the plasma gas using the remote plasma source, introducing a reactant gas dose into the reaction volume and purging the reactant gas dose.

11. The method of claim 10, further comprising:
    performing a post plasma treatment using the plasma gas.

12. The method of claim 11, further comprising:
    purging the post plasma treatment.

* * * * *